United States Patent
Schnell et al.

(10) Patent No.: US 8,161,925 B2
(45) Date of Patent: Apr. 24, 2012

(54) VALVE DRIVE FOR AN INTERNAL COMBUSTION ENGINE

(75) Inventors: Oliver Schnell, Veitsbronn (DE); Tim Matthias Hosenfeldt, Nürnberg (DE)

(73) Assignee: Schaeffler KG, Herzogenaurach (DE)

( * ) Notice: Subject to any disclaimer, the term of this patent is extended or adjusted under 35 U.S.C. 154(b) by 644 days.

(21) Appl. No.: 12/091,643

(22) PCT Filed: Nov. 3, 2006

(86) PCT No.: PCT/EP2006/068067
§ 371 (c)(1),
(2), (4) Date: Dec. 8, 2008

(87) PCT Pub. No.: WO2007/054464
PCT Pub. Date: May 18, 2007

(65) Prior Publication Data
US 2009/0217896 A1 Sep. 3, 2009

(30) Foreign Application Priority Data
Nov. 10, 2005 (DE) .......................... 10 2005 053 607

(51) Int. Cl.
*F01L 1/34* (2006.01)
(52) U.S. Cl. ................... 123/90.16; 123/90.39
(58) Field of Classification Search ............... 123/90.16, 123/90.48, 90.39
See application file for complete search history.

(56) References Cited

U.S. PATENT DOCUMENTS

| | | | | |
|---|---|---|---|---|
| 5,048,474 A | * | 9/1991 | Matayoshi et al. | 123/90.18 |
| 5,237,967 A | | 8/1993 | Willermet et al. | |
| 6,244,257 B1 | * | 6/2001 | Hu | 123/568.14 |
| 6,478,682 B1 | | 11/2002 | Kura et al. | |
| 6,679,210 B2 | * | 1/2004 | Iijima | 123/90.36 |

FOREIGN PATENT DOCUMENTS

| | | |
|---|---|---|
| DE | 2157155 | 5/1973 |
| DE | 2158156 | 5/1973 |
| DE | 4435400 | 4/1996 |
| DE | 19822898 | 11/1999 |
| DE | 19822900 | 11/1999 |
| DE | 19914046 | 9/2000 |
| EP | 1469213 | 10/2004 |
| JP | 2001-152319 | 6/2001 |
| JP | 2002-97906 | 4/2002 |
| JP | 2002-371809 | 12/2002 |

* cited by examiner

*Primary Examiner* — Zelalem Eshete
(74) *Attorney, Agent, or Firm* — Fitzpatrick, Cella, Harper & Scinto

(57) ABSTRACT

Proposed is a valve drive for an internal combustion engine, having a gas exchange valve (11) and having a valve actuating element (4) which has a contact face (8) for an end face (9) on a valve shank (10) of the gas exchange valve (11) which is actuated in the opening and closing direction by the valve actuating element (4). Here, the contact face (8) and/or the end face (9) should be provided with a wear prevention layer (12) which is composed of at least one metal-free amorphous hydrocarbon layer with $sp^2$ and $sp^3$ hybridized carbon.

12 Claims, 4 Drawing Sheets

VALVE DRIVE FOR AN INTERNAL COMBUSTION ENGINE

CROSS REFERENCE TO RELATED APPLICATIONS

This Application is a National Stage filing under 35 U.S.C. §371 of International Application No. PCT/EP2006/068067, filed Nov. 3, 2006. That application was published in English as International Publication No. WO 2007/054464 A1 on May 18, 2007, and claims priority to German Patent Application No. 10 2005 053 607.7, filed Nov. 10, 2005. Both of those applications are incorporated by reference herein in their entireties, as if fully set forth herein.

FIELD OF THE INVENTION

The invention relates to a valve drive for an internal combustion engine, having a gas exchange valve and having a valve actuating element which has a contact face for an end face on a valve shank of the gas exchange valve which is actuated in the opening and closing direction by the valve actuating element.

BACKGROUND OF THE INVENTION

Depending on the valve drive architecture, the contact region, referred to below as valve shank contact region, between the contact face of the valve actuating element and the end face on the valve shank is subjected to a high mechanical loading, which can both lead to premature surface wear on one of the two contact partners and also contribute considerably to undesired valve drive friction. In the case of a lever valve drive, therefore, there is a sliding movement of the contact face of the rotationally moved valve actuating element on the end face of the linearly moved valve shank. Here, however, despite high sliding speeds, the formation of a continuous elasto-hydrodynamic lubricating film in the valve shank contact region is hindered on account of the direction reversal of said sliding movement. In connection with high contact pressures, this leads both to a high level of sliding friction, which can generate a significant proportion of the valve drive power loss which is relevant for the fuel consumption of the internal combustion engine, and also to the risk of premature surface wear of the contact partners, in particular in the event of the lubricating film being contaminated with abrasive particles in the lubricating oil.

This consideration also applies to a tappet valve drive whose valve actuating element is moved linearly and generally parallel to the gas-exchange valve. In this case, although no significant sliding speeds in the valve shank contact region result from a lateral migration of the contact face of the valve actuating on the end face on the valve shank, microscopic movements in the valve shank contact region generated by a rotation of the gas exchange valve or of the valve actuating element can lead to similarly undesirable aftereffects with regard to valve drive friction or surface wear.

Conventional measures for wear prevention at the valve shank contact region are firstly inductive hardening of the valve shank end and secondly heat treatment, if appropriate with subsequent nitriding, for surface hardening of the valve actuating element. In the case of very high contact pressures, it is likewise known to weld plates composed of hard metal or hardenable material to the valve shank. Said measures can however have an unsatisfactory effect in particular under the combined loading of the valve shank contact region as a result of high sliding speeds and contact pressures and by contaminated lubricating oil, or in the case of plates which are to be welded on, can lead to undesirably high production costs. Furthermore, no measures are known which, in addition to a permanently sufficient level of wear prevention, bring about a significant reduction of the power loss generated as a result of friction in the valve shank contact region.

OBJECT OF THE INVENTION

The invention is therefore based on the object of avoiding said highlighted disadvantages and therefore creating a wear-resistant and at the same time low-friction valve shank contact region between the valve actuating element and gas exchange valve.

SUMMARY OF THE INVENTION

According to the invention, said object is achieved in that the contact face and/or the end face is provided with a wear prevention layer which is composed of at least one metal-free amorphous hydrocarbon layer with $sp^2$ and $sp^3$ hybridized carbon. A contact partner which is coated with the amorphous hydrocarbon layer is distinguished, in addition to excellent wear resistance, by a reduced friction coefficient. In this way, it is possible firstly to also better satisfy ever-increasing demands on the service life of the valve drive and secondly to make a further contribution to reducing the fuel consumption of the internal combustion engine. The first criterion can be highly significant for diesel internal combustion engines in which the exhaust-gas treatment by means of a particle filter leads to an increased exhaust-gas back pressure and, as a result, to increased contamination of the lubricating oil with abrasive soot particles.

In a refinement of the invention, the valve actuating element should be embodied as a valve lever which is acted on at least indirectly by a cam, with the contact face running on an end section which is materially connected to the valve lever. A valve lever which is acted on directly by the cam is known to a person skilled in the art as a tilting lever with a central pivot point, which is acted on at its first end section by a tappet rod or a valve tappet and which, with its contact face formed on the second end section, actuates the end face on the valve shank of the gas exchange valve. Examples of valve levers which are acted on indirectly by the cam are primarily rocker arms and oscillating arms with a pivot bearing at the end side and a central cam tapping face, or else tilting levers with a cam tapping face at the end side and a central pivot bearing. As pivot bearings, use is made usually of support elements which are mounted, depending on the type of valve lever, either standing or suspended in the cylinder head of the internal combustion engine, or of pivot axles which are arranged in the longitudinal direction of the cylinder head.

It is alternatively provided that the valve actuating element is embodied as a hydraulic valve play compensating element which is moved with the gas exchange valve in its opening and closing direction and which forms a modular unit with a housing, a compensating piston which is mounted in a longitudinally movable manner and which delimits a pressure space in the housing, a non-return valve and a restoring spring, which modular unit is provided in particular for being held in a bucket tappet, with the contact face running on an end side of the housing. A valve play compensating element of said type is known as a separately produced functional and modular unit for directly actuated bucket tappet valve drives with hydraulic valve play compensation, and can be used in a modular fashion with bucket tappets of different diameter or with differently-shaped cam tapping faces.

In the case that the hydraulic valve play compensating element is provided as a modular unit for being held in an oscillating arm or a tilting lever, said hydraulic valve play compensating element should additionally comprise a joint shoe which is retained on the housing and on the end side of which the contact face runs. A joint shoe of said type is known to a person skilled in the art as a measure which can be easily implemented in order to reduce the contact pressures also in lever-valve drives with a contact face of the valve play compensating element which migrates laterally on the end face of the valve shank.

Alternatively, the valve drive can also have a mechanical valve play adjusting arrangement by virtue of the valve actuating element being embodied as a single-part bucket tappet with a hollow cylindrical wall which is mounted in a longitudinally movable manner in a guide of the internal combustion engine and which merges at one end into a base. The base which is acted on at the outside by a cam has, at the inside, an elevation, of a defined height corresponding to the valve play to be set, which faces towards the gas exchange valve, with the contact face running on an end side of the elevation.

In the case of a bucket tappet valve drive having a mechanical valve play adjusting arrangement, it can however also be provided that the valve actuating element is embodied as an underlying adjusting disc of a defined thickness corresponding to the valve play to be set and with an end-side contact face, with the base of the bucket tappet being acted on at the outside by a cam either indirectly via a run-on disc or directly and bearing at the inside against the adjusting disc.

The invention also encompasses a valve drive having mechanical valve play adjustment by means of an adjusting cap. Said adjusting cap engages around the valve shank with a hollow cylindrical wall which merges at one end into a base with a defined thickness corresponding to the valve play to be set, with the end face on the valve shank running on an outer side of the base.

It can also be provided that the valve actuating element is embodied as a valve lever, which is acted on by a cam, with mechanical valve play adjustment, with the contact face running on an end side of an adjusting screw which is screwed into the valve lever at the valve side. An adjusting screw of said type is known to a person skilled in the art as a cost-effective and lightweight solution for continuously variable valve play adjustment in particular in the case of tilting levers and rocker arms but also in the case of oscillating arms.

According to one preferred refinement of the invention, the amorphous hydrocarbon layer has a hydrogen proportion of a maximum of 16 atom % and process-induced impurities, for example in the form of O or Ar atoms, metals or the like, of less than 1 atom %. In this way, a surface which is provided with the wear prevention layer and which can be either the contact face of the valve actuating element or the end face on the valve shank has, while having a high level of resistance to abrasive wear, a low adhesive tendency with respect to its contact partner with a metallic surface. At the same time, a hydrocarbon layer of said type is characterized by a high chemical resistance, high mechanical strengths and high hardness/modulus of elasticity properties. A higher hydrogen proportion could lead to undesired connections to lubricants or the like.

The amorphous hydrocarbon layer should also have a thickness of approximately 0.8 µm to 2.5 µm. Here, according to a further preferred embodiment, at least one adhesion-promoting layer and/or at least one intermediate layer can be provided under the amorphous hydrocarbon layer. The adhesion-promoting layer is expediently composed of metallic substances, borides, carbides and/or nitrides of the transition metals and has a thickness of approximately 0.1 µm to 0.5 µm.

The intermediate layer should preferably be formed as a metal-containing hydrocarbon layer, whose metal components are composed of W, Ti, Hf, Ge or a combination of the above components, and have a thickness of approximately 0.5 µm to 2.0 µm.

The invention is explained in more detail on the basis of the following exemplary embodiments.

BRIEF DESCRIPTION OF THE DRAWINGS

The invention is explained by way of example on the basis of the appended drawings for various valve actuating elements of different valve drive architectures. In the drawings.

DETAILED DESCRIPTION OF THE DRAWINGS

In the figures, identical or functionally equivalent components are denoted by the same reference symbols unless stated otherwise.

Figure 1:
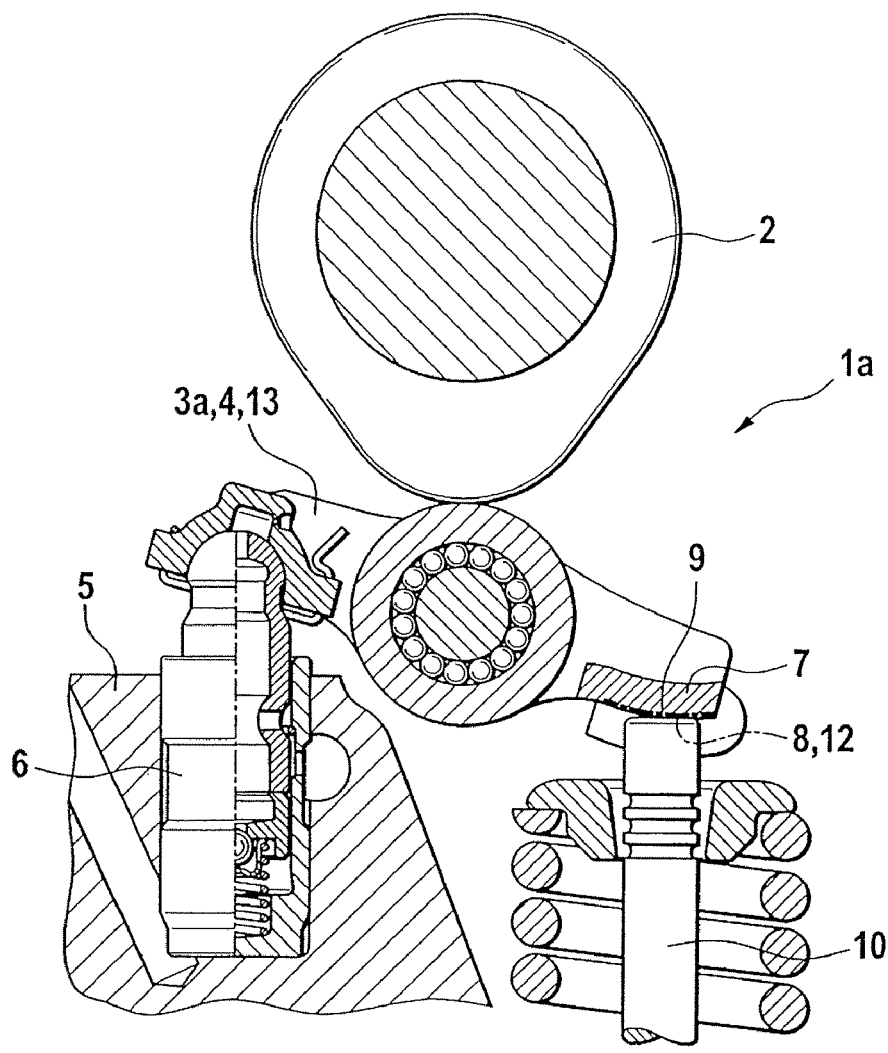
FIG. 1 shows a rocker arm valve drive in cross section.

FIG. 1 shows a valve drive 1a, embodied as a lever valve drive, of an internal combustion engine, having a valve actuating element 4 which is actuated by a cam 2 and which is embodied as a valve lever 3a and which is pivotably supported at one end on a support element 6, with hydraulic valve play compensation, which is mounted in a stationary fashion in a cylinder head 5 of the internal combustion engine. A contact face 8 for an end face 9 on a valve shank 10 of a gas exchange valve 11 runs on an end section 7 which is situated opposite the support element 6 and which is materially connected to the valve lever 3a. The forces which are to be transmitted from the contact face 8 to the end face 9 for actuating the gas exchange valve 11 in its opening and closing direction lead to high mechanical pressures in the valve shank contact regions in particular at high speeds of the internal combustion engine. In the case of the lever valve drive 1a illustrated here, a reciprocating sliding movement of the contact face 8 on the end face 9 is superposed on said pressures. Since the direction reversal of said sliding movement hinders the formation of a continuous elasto-hydrodynamic lubricating film in the valve shank contact region, the risk of an inadmissibly high adhesive and/or abrasive wear of the contact partners, contact face 8 and end face 9, increases with increasing contact forces.

In order to avoid said risk, which increases further with a comparatively high proportion of abrasive particles in the lubricating oil, the application of a wear prevention layer 12 is provided. Said wear prevention layer 12, which is explained in yet more detail below, can be applied to the contact face 8 of the valve actuating element 4 or to the end face 9 on the valve shank 10 or also to both contact partners. Taking production and cost aspects into consideration, it can however be sufficient to provide the wear prevention layer 12 only on one contact partner and, as illustrated by dash-dotted lines in FIG. 1, only on the contact face 8 of the valve lever 3a.

Figure 2:
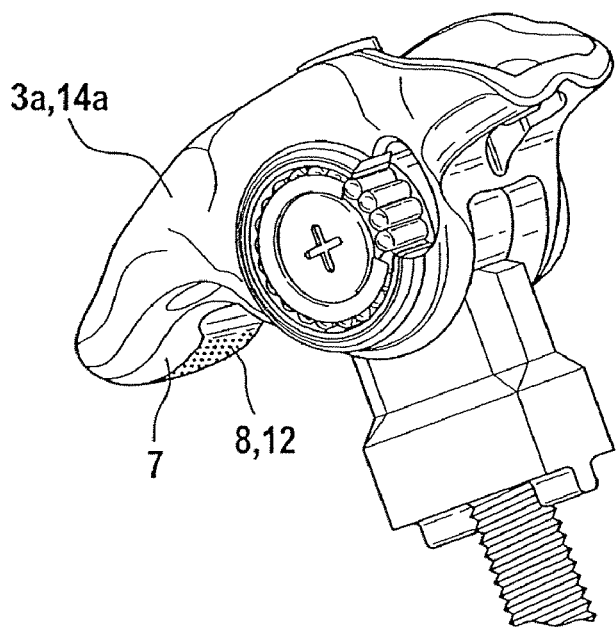
FIG. 2 shows a tilting lever of a push-rod valve drive in a perspective illustration.

While the valve lever 3a in FIG. 1 is embodied as a rocker arm 13, FIG. 2 shows the valve lever 3a in the form of a rolling-bearing-mounted tilting lever 14a as is known from push-rod valve drives with an underlying camshaft. The tilting lever 14a also has an end section 7 which is materially connected to said tilting lever 14a and on which the contact face 8 which is provided with the wear prevention layer 12 (illustrated by dotted lines) runs.

Figure 3:
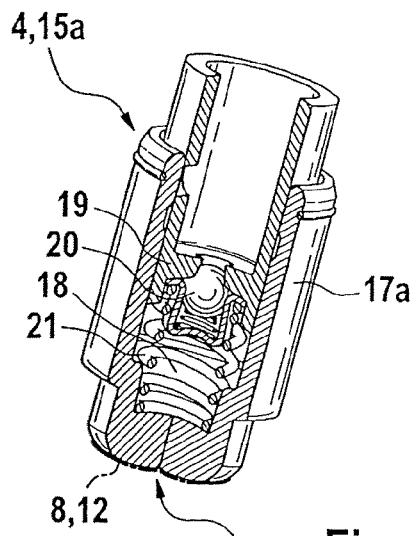
FIG. 3 shows a hydraulic valve play compensating element in a cut-away perspective illustration.
Figure 4:
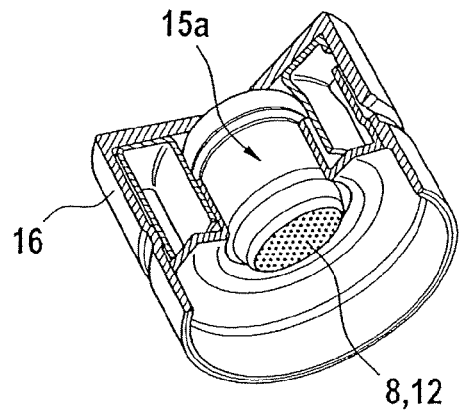
FIG. 4 shows a bucket tappet having a valve play compensating element as per FIG. 3.

In FIG. 3, the valve actuating element 4 is embodied as a hydraulic valve play compensating element 15a which is moved with the gas exchange valve 11 in its opening and closing direction. As can also be seen from FIG. 4, a valve play compensating element 15a of said type is provided as a modular and functional unit, in particular for being held in a bucket tappet 16, and substantially comprises a housing 17a, a compensating piston 19 which is mounted in a longitudinally movable manner and which delimits a pressure space 18 in the housing 17a, a non-return valve 20 and a restoring spring 21. In this case, the contact face 8 which is provided with the wear prevention layer 12 runs on an end side 22 of the housing 17a. The wear prevention layer 12 is illustrated in FIG. 3 by dash-dotted lines and in FIG. 4 by dotted lines.

Figure 5:
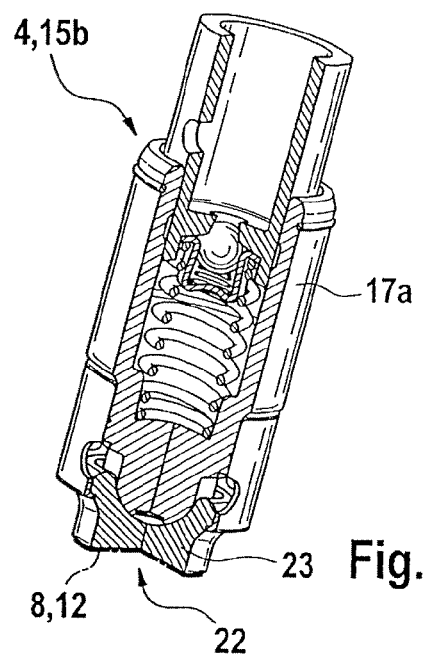
FIG. 5 shows a hydraulic valve play compensating element having a joint shoe in a cut-away perspective illustration.
Figure 6:
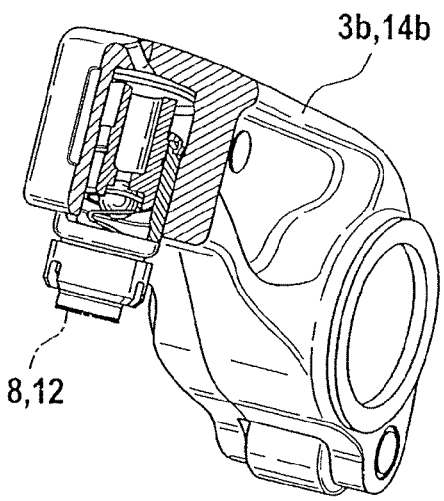
FIG. 6 shows a cam-actuated rocker arm having a valve play compensating element as per FIG. 5 in a partially sectioned perspective illustration.
Figure 7:
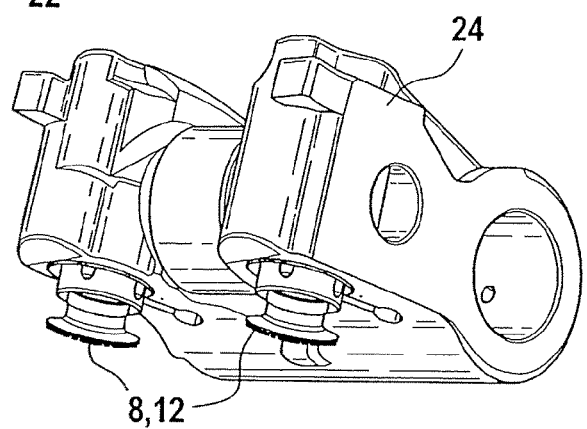
FIG. 7 shows a double rocker arm with valve play compensating elements as per FIG. 5 in a perspective illustration.

A hydraulic valve play compensating element 15b illustrated in FIG. 5 differs from that of FIG. 3 primarily in that it forms a functional and modular unit with an additional joint shoe 23 which is retained on the housing 17b and which is normally used in the case of valve levers with a concomitantly moved hydraulic valve play compensating element. A typical exemplary embodiment of a valve lever 3b of said type is an axle-mounted tilting lever 14b as per FIG. 6 and an axle-mounted oscillating lever 24 which is embodied in FIG. 7 as a double oscillating lever for the simultaneous actuation of two gas exchange valves 11. In the case of the valve play compensating element 15b with a joint shoe 23, the contact face 8 which is provided with the wear prevention layer 12 (illustrated in each case by dash-dotted lines in FIGS. 5 to 7) runs on the end side 22 of the joint shoe 23.

Figure 8:
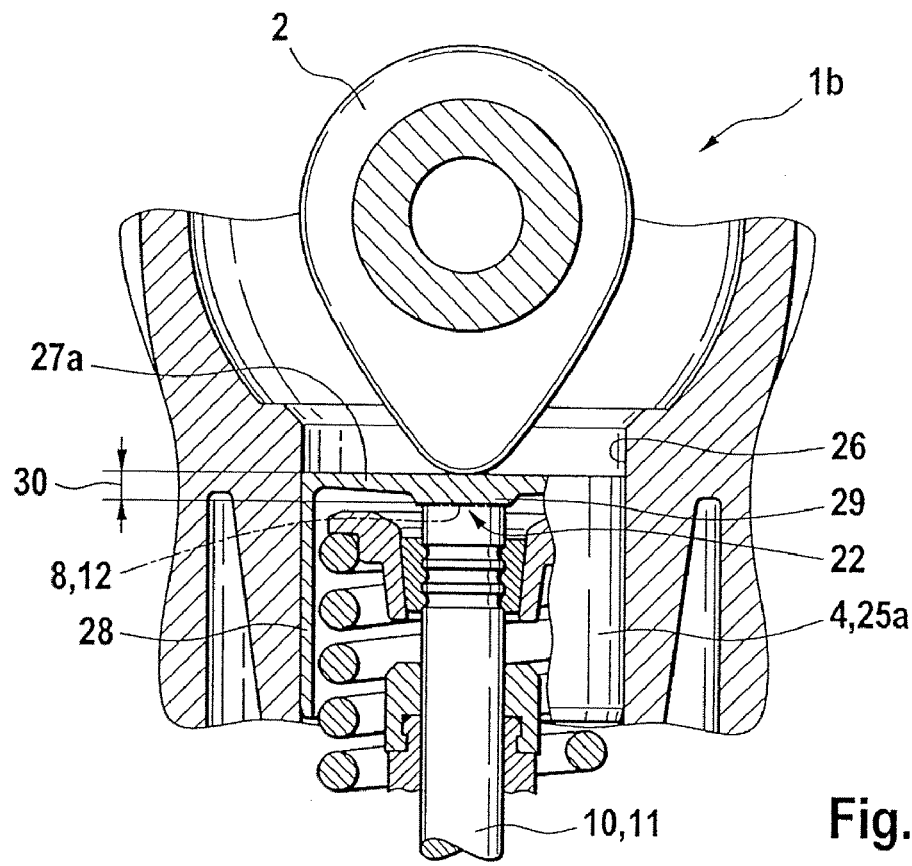
FIG. 8 shows a bucket tappet valve drive with a mechanical valve play adjusting arrangement and a single-piece bucket tappet in cross section.

FIG. 8 shows a valve drive 1b with mechanical valve play adjustment in which the valve actuating element 4 is embodied as a single-part bucket tappet 25a with a hollow cylindrical wall 28 which is mounted in a longitudinally movable manner in a guide 26 of the internal combustion engine and which merges at one end into a base 27a. The base 27a which is acted on at the outside by the cam 2 has, at the inside, an elevation 29 which faces towards the gas exchange valve 11 and by means of the height 30 of which the valve play is set. Here, the contact face 8 which is provided with the wear prevention layer 12 runs on the end side 22 of the elevation 29.

Figure 9:
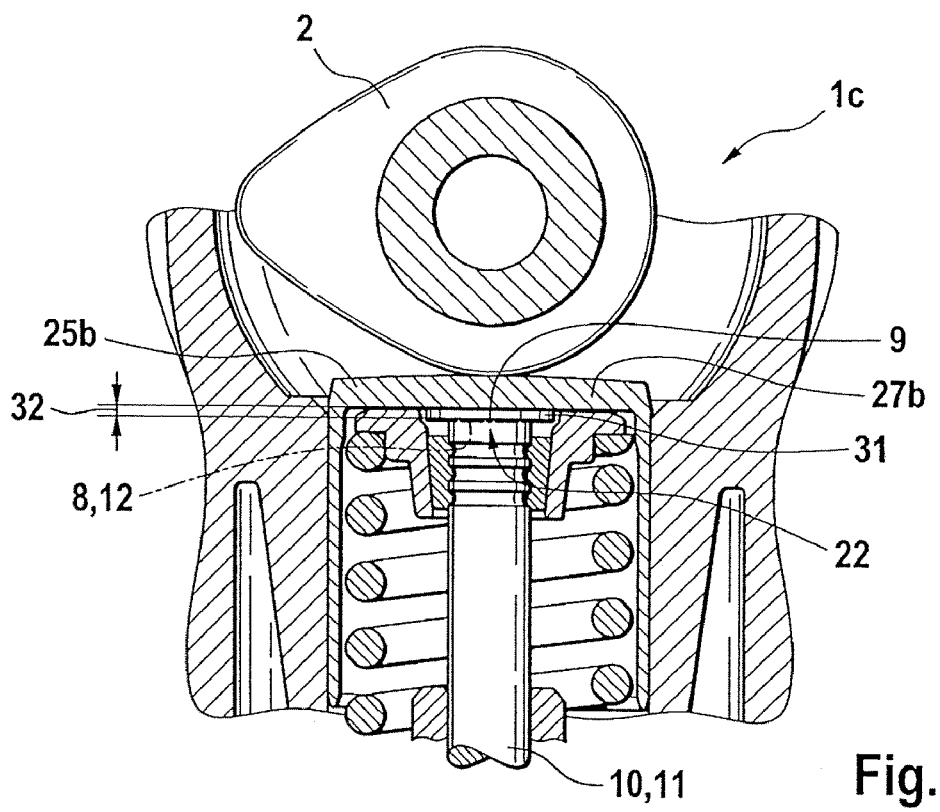
FIG. 9 shows a bucket tappet valve drive with a mechanical valve play adjusting arrangement and an underlying adjusting disc in cross section.

In contrast, the valve play of a valve drive 1c as per FIG. 9 is set by means of an adjusting disc 31 of a defined thickness 32. Said adjusting disc 31 is arranged between a base 27b of the bucket tappet 25b and the end face 9 on the valve shank 10, with the contact face 8 which is provided with the wear prevention layer 12 (illustrated by dash-dotted lines) running on that end side 22 of the adjusting disc 31 which faces toward the end side 9. However, in order to avoid the need for directional assembly of the adjusting disc 31, it can also be expedient in this case to provide both end sides of the adjusting disc 31 with the wear prevention layer 12.

Figure 10:
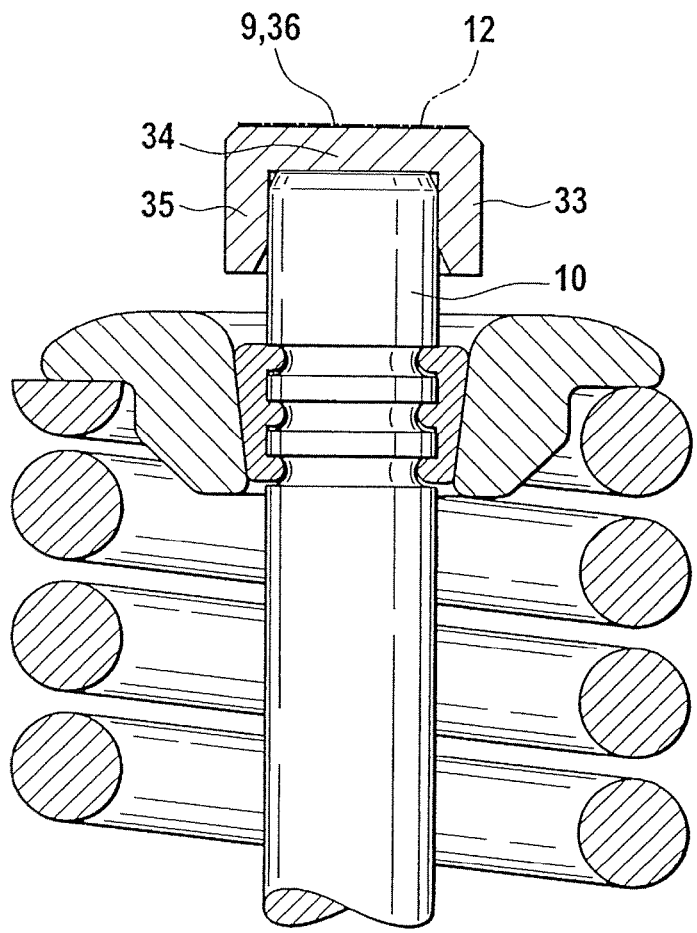
FIG. 10 shows a gas exchange valve with an adjusting cap for mechanical valve play adjustment in cross section.

In a further exemplary embodiment as per FIG. 10, an adjusting cap 33 is provided which engages over the valve shank 10 with a hollow cylindrical wall 35 which merges at one end into a base 34 with a defined thickness. In this case, an outer side 36, which is provided with the wear prevention layer 12 (illustrated by dash-dotted lines), of the base 34 is defined as an end face 9 on the valve shank 10.

Figure 11:
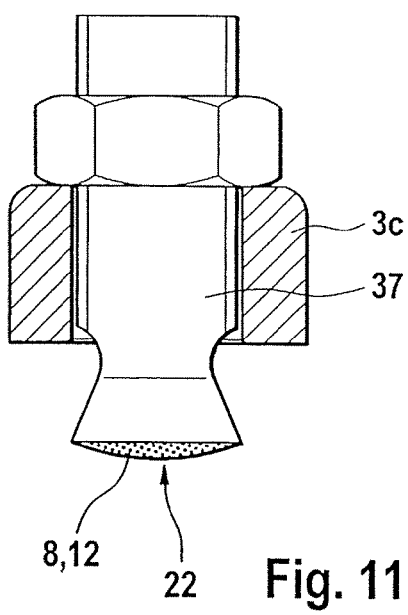
FIG. 11 shows a valve lever with an adjusting screw for mechanical valve play adjustment in longitudinal section.

In contrast to the exemplary embodiments illustrated in FIGS. 8 to 10 with stepped mechanical valve play adjustment, FIG. 11 shows an adjusting screw 37, which is screwed into a valve lever 3c at the valve side, for continuously variable mechanical valve play adjustment. Such a valve play adjusting arrangement is preferably used in the case of tilting levers and rocker arms, with the contact face 8 which is provided with the wear prevention layer 12 (illustrated by dotted lines) running on the convexly-shaped end side 22 of the adjusting screw 37.

Figure 12:
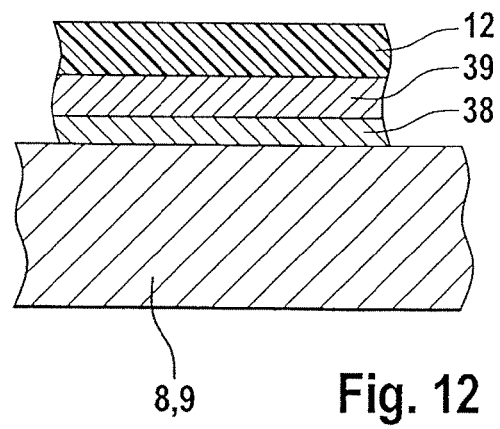
FIG. 12 shows a wear prevention layer according to the invention in a greatly-enlarged illustration.

The wear prevention layer 12 which is applied to the contact face 8 of the valve actuating element 4 or the end face 9 on the valve shank 10 can finally be seen from FIG. 12 in a greatly enlarged illustration. Here, it is expedient for an adhesion-promoting layer 38 composed of chrome to firstly be deposited on the contact face 8 or end face 9. This takes place by means of a PVD process (physical vapour deposition), with process-induced impurities for example as a result of O or Ar atoms, metals of the like of up to 1 atom % being tolerable. The adhesion-promoting layer 38 has a thickness of 0.1 µm to 0.5 µm and serves for an improved connection of an intermediate layer 39 and the wear-prevention layer 12 to the contact face 8 or the end face 9.

The intermediate layer 39 is deposited on the adhesion-promoting layer 38 likewise by means of a PVD process and is formed as a metal-containing hydrocarbon layer (ME-C:H) with a maximum of 20% W and a maximum of 20% H. The thickness of the intermediate layer 39 is approximately 0.5 µm to 2.0 µm and serves for improved attachment of the wear prevention layer 12 to the adhesion-promoting layer 38. The wear-prevention layer 12 is formed as an amorphous hydrocarbon layer (a-C:H) and is preferably deposited on the intermediate layer 39 by means of a PVD and/or (PA)CVD process (plasma assisted chemical vapour deposition).

The overall layer constructed from the adhesion-promoting layer 38, the intermediate layer 39 and the wear prevention layer 12 has a layer thickness of approximately 1.0 µm to 5.0 µm. As a result of such a layer thickness, the dimensions of the coated components are altered to such a small degree that no further machining is necessary, and the generated surface structure or topography of the coated surface is maintained. The amorphous hydrocarbon layer likewise has little need for a retroactive heat treatment. Here, the low friction coefficient of the wear prevention layer 12 leads to a considerable reduction in the friction power generated in the valve shank contact region.

LIST OF REFERENCE SYMBOLS 1a,b,c Valve drive
2 Cam
3a,b,c Valve lever
4 Valve actuating arrangement
5 Cylinder head
6 Support element
7 End section
8 Contact face
9 End face
10 Valve shank
11 Gas exchange valve 12 Wear prevention layer
13 Rocker arm
14a,b Tilting lever
15a,b Hydraulic valve play compensating element
16 Bucket tappet
17a,b Housing
18 Pressure space
19 Compensating piston
20 Non-return valve
21 Restoring spring
22 End side
23 Joint shoe
24 Rocker arm
25a,b Bucket tappet
26 Guide
27a,b Base
28 Wall
29 Elevation
30 Height
31 Adjusting disc
32 Thickness
33 Adjusting cap
34 Base
35 Wall
36 Outer side
37 Adjusting screw
38 Adhesion-promoting layer
39 Intermediate layer

The invention claimed is:

1. A valve drive for an internal combustion engine, having a gas exchange valve and having a valve actuating element which has a contact face for an end face on a valve shank of the gas exchange valve which is actuated in the opening and closing direction by the valve actuating element, wherein the contact face and/or the end face is provided with a wear prevention layer which is composed of at least one metal-free amorphous hydrocarbon layer with $sp^2$ and $sp^3$ hybridized carbon, and wherein the amorphous hydrocarbon layer has a hydrogen proportion of a maximum of 16 atom %, wherein at least one adhesion-promoting layer and/or at least one intermediate layer is provided under the amorphous hydrocarbon layer, and wherein the at least one intermediate layer is formed as a metal-containing hydrocarbon layer, whose metal components are composed of W, Ti, Hf, or Ge or a combination thereof, and has a thickness of approximately 0.5 μm to 2.0 μm.

2. The valve drive according to claim 1, wherein the valve actuating element is embodied as a valve lever which is acted on at least indirectly by a cam, with the contact face running on an end section which is materially connected to the valve lever.

3. The valve drive according to claim 1, wherein the valve actuating element is embodied as a hydraulic valve play compensating element which is moved with the gas exchange valve in its opening and closing direction and which forms a modular unit with a housing, a compensating piston which is mounted in a longitudinally movable manner and which delimits a pressure space in the housing, a non-return valve and a restoring spring, which modular unit is provided in particular for being held in a bucket tappet, with the contact face running on an end side of the housing.

4. The valve drive according to claim 1, wherein the valve actuating element is embodied as a hydraulic valve play compensating element which is moved with the gas exchange valve in its opening and closing direction and which forms a modular unit with a housing, a compensating piston which is mounted in a longitudinally movable manner and which delimits a pressure space in the housing, a non-return valve, a restoring spring and a joint shoe which is retained on the housing, which modular unit is provided in particular for being held in a rocker arm or a tilting lever, with the contact face running on an end side of the joint shoe.

5. The valve drive according to claim 1, wherein the valve drive has a mechanical valve play adjusting arrangement, by virtue of the valve actuating element being embodied as a single-part bucket tappet with a hollow cylindrical wall which is mounted in a longitudinally movable manner in a guide of the internal combustion engine and which merges at one end into a base, which base is acted on at the outside by a cam and has, at the inside, an elevation, of a defined height, which faces towards the gas exchange valve, with the contact face running on an end side of the elevation.

6. The valve drive according to claim 1, wherein the valve drive has a mechanical valve play adjusting arrangement, by virtue of the valve actuating element being embodied as an underlying adjusting disc, of a defined thickness, for a bucket tappet which has a hollow cylindrical wall which is mounted in a longitudinally movable manner in a guide of the internal combustion engine and which merges at one end into a base, which base is acted on at the outside by a cam either indirectly via a run-on disc or directly and bears at the inside against the adjusting disc, with the contact face running on an end side of the adjusting disc.

7. The valve drive according to claim 1, wherein the valve drive has a mechanical valve play adjusting arrangement by means of an adjusting cap which engages around the valve shank with a hollow cylindrical wall which merges at one end into a base with a defined thickness, with the end face on the valve shank running on an outer side of the base.

8. The valve drive according to claim 1, wherein the valve actuating element (4) is embodied as a valve lever, which is acted on by a cam, with mechanical valve play adjustment, with the contact face running on an end side of an adjusting screw which is screwed into the valve lever.

9. The valve drive according to claim 1, wherein the amorphous hydrocarbon layer has process-induced impurities of less than 1 atom %.

10. The valve drive according to claim 1, wherein the amorphous hydrocarbon layer has a thickness of approximately 0.8 μm to 2.5 μm.

11. The valve drive according to claim 1, wherein the at least one adhesion-promoting layer is composed of metallic substances, borides, carbides and/or nitrides of the transition metals and has a thickness of approximately 0.1 μm to 0.5 μm.

12. A valve drive for an internal combustion engine, comprising a gas exchange valve and having a rocker arm which has a contact face for contacting an end face on a valve shank of the gas exchange valve which is selectively actuated in an opened position and a closed position by the rocker arm, wherein the contact face has a wear prevention layer which is composed of at least one metal-free amorphous hydrocarbon layer with $sp^2$ and $sp^3$ hybridized carbon, and wherein the amorphous hydrocarbon layer has a hydrogen proportion of a maximum of 16 atom %, wherein at least one adhesion-promoting layer and/or at least one intermediate layer is provided under the amorphous hydrocarbon layer, and wherein the at least one intermediate layer is formed as a metal-containing hydrocarbon layer, whose metal components are composed of W, Ti, Hf, or Ge or a combination thereof, and has a thickness of approximately 0.5 μm to 2.0 μm.

* * * * *